(12) United States Patent
Endean et al.

(10) Patent No.: US 11,390,517 B2
(45) Date of Patent: *Jul. 19, 2022

(54) SYSTEMS AND METHODS FOR BIAS SUPPRESSION IN A NON-DEGENERATE MEMS SENSOR

(71) Applicant: Honeywell International Inc., Morris Plains, NJ (US)

(72) Inventors: Daniel Endean, Plymouth, MN (US); John Reinke, Plymouth, MN (US)

(73) Assignee: Honeywell International Inc., Charlotte, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/917,292

(22) Filed: Jun. 30, 2020

(65) Prior Publication Data

US 2020/0346920 A1 Nov. 5, 2020

Related U.S. Application Data

(63) Continuation of application No. 15/466,778, filed on Mar. 22, 2017, now Pat. No. 10,696,541.

(Continued)

(51) Int. Cl.
*B81B 3/00* (2006.01)
*G01C 19/574* (2012.01)
(Continued)

(52) U.S. Cl.
CPC .......... *B81B 3/0021* (2013.01); *B81B 3/0072* (2013.01); *B81B 7/0058* (2013.01);
(Continued)

(58) Field of Classification Search
CPC ............ G01C 19/5747; G01C 19/5719; G01C 19/574; G01C 19/5712; G01C 19/5726; B81B 3/0021; B81B 3/0072; B81B 7/0058

See application file for complete search history.

(56) References Cited

U.S. PATENT DOCUMENTS 5,349,855 A 9/1994 Bernstein et al.
6,089,089 A * 7/2000 Hsu .................... G01C 19/5719
                                                           73/1.77

(Continued)

FOREIGN PATENT DOCUMENTS

CA 2548728 C 10/2009
CA 2756485 A1 9/2010

(Continued)

OTHER PUBLICATIONS

Azgin, "High Performance MEMS Gyroscopes", A Thesis Submitted to the Graduate School of Natural and Applied Sciences of Middle East Technical University, Feb. 2007, pp. 1-172, Middle East Technical University.

(Continued)

*Primary Examiner* — Helen C Kwok

(74) *Attorney, Agent, or Firm* — Fogg & Powers LLC

(57) ABSTRACT

Systems and methods for suppressing bias in a non-degenerate vibratory structure are provided. In certain embodiments, a vibratory structure includes a first proof mass; a second proof mass, wherein the first proof mass and the second proof mass are driven into motion along a first axis, wherein the first proof mass and the second proof mass move in anti-phase along a second axis, wherein the motion of the first proof mass and the second proof mass along the second axis is such that the centers of mass of the first proof mass and the second proof mass move collinearly along a same axis.

19 Claims, 7 Drawing Sheets

Related U.S. Application Data

(60) Provisional application No. 62/342,132, filed on May 26, 2016.

(51) Int. Cl.
- *G01C 19/5719* (2012.01)
- *G01C 19/5747* (2012.01)
- *B81B 7/00* (2006.01)

(52) U.S. Cl.
CPC ....... *G01C 19/574* (2013.01); *G01C 19/5719* (2013.01); *G01C 19/5747* (2013.01); *B81B 2201/0242* (2013.01); *B81B 2203/0118* (2013.01)

(56) References Cited

U.S. PATENT DOCUMENTS

| | | |
|---|---|---|
| 6,151,965 A | 11/2000 | Watarai |
| 6,250,156 B1 | 6/2001 | Seshia et al. |
| 6,289,733 B1 | 9/2001 | Challoner et al. |
| 6,308,567 B1 | 10/2001 | Higuchi et al. |
| 6,467,349 B1 * | 10/2002 | Andersson ......... G01C 19/5656 73/504.14 |
| 6,578,420 B1 | 6/2003 | Hsu |
| 6,742,390 B2 | 6/2004 | Mochida et al. |
| 6,837,107 B2 | 1/2005 | Geen |
| 6,848,304 B2 | 2/2005 | Geen |
| 7,032,451 B2 | 4/2006 | Geen |
| 7,036,373 B2 | 5/2006 | Johnson et al. |
| 7,100,446 B1 | 9/2006 | Acar et al. |
| 7,401,397 B2 | 7/2008 | Shcheglov et al. |
| 7,810,394 B2 | 10/2010 | Yazdi |
| 7,832,271 B2 | 11/2010 | Mita et al. |
| 7,905,146 B2 | 3/2011 | Suzuki |
| 8,006,557 B2 | 8/2011 | Fin et al. |
| 8,113,050 B2 | 2/2012 | Acar et al. |
| 8,256,290 B2 * | 9/2012 | Mao ................... G01C 19/5719 73/504.12 |
| 8,288,188 B2 | 10/2012 | Mita et al. |
| 8,322,213 B2 | 12/2012 | Trusov et al. |
| 8,342,023 B2 | 1/2013 | Wolfram et al. |
| 8,347,717 B2 | 1/2013 | Seeger et al. |
| 8,429,970 B2 | 4/2013 | Rocchi |
| 8,459,110 B2 | 6/2013 | Cazzaniga et al. |
| 8,479,575 B2 | 7/2013 | Kempe |
| 8,544,594 B2 | 10/2013 | Yacine |
| 8,616,056 B2 | 12/2013 | Sammoura et al. |
| 8,640,541 B2 | 2/2014 | Abdel Aziz et al. |
| 8,661,897 B2 | 3/2014 | Coronato et al. |
| 8,661,898 B2 | 3/2014 | Watson |
| 8,733,172 B2 | 5/2014 | Coronato et al. |
| 8,789,416 B2 | 7/2014 | Rocchi |
| 8,794,066 B2 | 8/2014 | Merz et al. |
| 8,800,370 B2 | 8/2014 | Schofield et al. |
| 8,919,199 B2 | 12/2014 | Judy et al. |
| 9,157,740 B2 | 10/2015 | Kempe |
| 9,194,704 B2 | 11/2015 | Lin et al. |
| 9,322,213 B2 | 4/2016 | Wang et al. |
| 9,551,577 B2 | 1/2017 | Ruohio et al. |
| 9,689,678 B2 | 6/2017 | Jeanroy et al. |
| 10,371,521 B2 | 8/2019 | Johnson |
| 10,696,541 B2 * | 6/2020 | Endean ............. G01C 19/5747 |
| 2003/0066351 A1 | 4/2003 | Weinberg et al. |
| 2005/0229703 A1 * | 10/2005 | Geen .................. G01C 19/574 73/510 |
| 2006/0032310 A1 | 2/2006 | Merassi et al. |
| 2009/0064781 A1 | 3/2009 | Ayaz et al. |
| 2009/0192403 A1 | 7/2009 | Gharib et al. |
| 2010/0063763 A1 | 3/2010 | Rozelle |
| 2010/0095768 A1 | 4/2010 | Acar et al. |
| 2010/0107391 A1 | 5/2010 | Lasalandra et al. |
| 2010/0223996 A1 | 9/2010 | Fukumoto |
| 2010/0257934 A1 | 10/2010 | Zhang et al. |
| 2010/0313657 A1 * | 12/2010 | Trusov ............. G01C 19/5747 73/504.16 |
| 2011/0270569 A1 | 11/2011 | Stephanou et al. |
| 2011/0303007 A1 | 12/2011 | Rocchi |
| 2012/0013355 A1 | 1/2012 | Narita et al. |
| 2012/0017677 A1 | 1/2012 | Merz et al. |
| 2012/0024056 A1 | 2/2012 | Hammer |
| 2012/0031977 A1 | 2/2012 | Havens et al. |
| 2012/0048017 A1 | 3/2012 | Kempe |
| 2012/0210788 A1 | 8/2012 | Günther et al. |
| 2012/0236507 A1 | 9/2012 | Koyama |
| 2012/0291548 A1 | 11/2012 | Kanemoto |
| 2013/0031977 A1 | 2/2013 | Kempe |
| 2013/0098153 A1 | 4/2013 | Trusov et al. |
| 2013/0125649 A1 | 5/2013 | Simoni et al. |
| 2013/0167636 A1 | 7/2013 | Coronato et al. |
| 2013/0192363 A1 | 8/2013 | Loreck et al. |
| 2013/0192365 A1 | 8/2013 | Zhuang et al. |
| 2013/0283908 A1 | 10/2013 | Geen et al. |
| 2014/0047921 A1 | 2/2014 | Seeger et al. |
| 2014/0116135 A1 | 5/2014 | Cazzaniga et al. |
| 2014/0116136 A1 | 5/2014 | Coronato et al. |
| 2014/0352431 A1 | 12/2014 | Leclerc |
| 2015/0211854 A1 * | 7/2015 | Ruohio ............. G01C 19/5712 73/504.12 |
| 2015/0330783 A1 | 11/2015 | Rocchi et al. |
| 2015/0377621 A1 | 12/2015 | Chaumet et al. |
| 2016/0025492 A1 | 1/2016 | Rocchi |
| 2016/0084654 A1 * | 3/2016 | Senkal ............... G01C 19/5726 73/502 |
| 2017/0089702 A1 | 3/2017 | Ruohio et al. |
| 2017/0184400 A1 * | 6/2017 | Valzasina ............. G01C 19/574 |
| 2018/0118557 A1 | 5/2018 | Endean et al. |
| 2018/0231384 A1 | 8/2018 | Johnson |
| 2019/0178645 A1 | 6/2019 | Senkal et al. |
| 2020/0096337 A1 | 3/2020 | Senkal et al. |
| 2020/0292313 A1 * | 9/2020 | Endean ................ G01C 19/574 |

FOREIGN PATENT DOCUMENTS

| | | |
|---|---|---|
| CN | 101261126 B | 6/2010 |
| CN | 101363731 B | 1/2011 |
| CN | 201945318 U | 8/2011 |
| CN | 102305626 A | 1/2012 |
| CN | 102636162 A | 8/2012 |
| CN | 202793402 U | 3/2013 |
| CN | 102278982 B | 7/2013 |
| CN | 103217151 A | 7/2013 |
| CN | 103575263 A | 2/2014 |
| CN | 103213939 B | 1/2016 |
| EP | 786645 A2 | 7/1997 |
| EP | 1432962 A1 | 6/2004 |
| EP | 1603830 A1 | 12/2005 |
| EP | 1899681 B1 | 5/2009 |
| EP | 1697696 B1 | 1/2010 |
| EP | 2160566 B1 | 12/2011 |
| EP | 2746724 A1 | 6/2014 |
| EP | 3187825 A1 | 7/2017 |
| JP | 2008145325 A | 6/2008 |
| JP | 2009192403 A | 8/2009 |
| JP | 2010096695 A | 4/2010 |
| JP | 4702942 B2 | 6/2011 |
| JP | 5030135 B2 | 9/2012 |
| RU | 2222780 C1 | 1/2004 |
| RU | 2234679 C2 | 8/2004 |
| RU | 2251077 C1 | 4/2005 |
| RU | 2423668 C1 | 7/2011 |
| WO | 03029754 A1 | 4/2003 |
| WO | 2009003541 A1 | 1/2009 |
| WO | 2009107573 A1 | 9/2009 |
| WO | 2011136970 A1 | 11/2011 |
| WO | 2013083534 A2 | 6/2013 |
| WO | 2013091866 A1 | 6/2013 |
| WO | 2013108804 A1 | 7/2013 |

(56) References Cited

OTHER PUBLICATIONS

European Patent Office, "Communication pursuant to Article 94(3) from EP Application No. 17162684.9", from Foreign Counterpart of U.S. Appl. No. 15/466,778, dated Nov. 14, 2018, pp. 1 through 8, Published in: EP.

European Patent Office, "Communication pursuant to Article 94(3) from UEP Application No. 17162859.7", "from Foreign Counterpart of U.S. Appl. No. 15/466,784", dated Aug. 17, 2018, pp. 1 through 6, Published in: EP.

European Patent Office, "Communication under Rule 71(3) from EP Application No. 17162859.7", from Foreign Counterpart to U.S. Appl. No. 15/466,784, dated Jun. 18, 2019, pp. 1 through 24, Published: EP.

European Patent Office, "Extended European Search Report for EP Application No. 17162684.9", from Foreign Counterpart to U.S. Appl. No. 15/466,778, dated Sep. 25, 2017, pp. 1 through 8, Published in: EP.

European Patent Office, "Extended European Search Report from EP Application No. 17162859.7", from Foreign Counterpart to U.S. Appl. No. 15/466,784, dated Sep. 26, 2017, pp. 1 through 9, Published: EP.

Senkal et al., "Minimal Realization of Dynamically Balanced Lumped Mass WA Gyroscope Dual Foucault Pendulum", "MicroSystems Laboratory, University of California", 2015, pp. 1-2, Publisher IEEE, Published in: Irvine, CA, USA.

U.S. Patent and Trademark Office, "Advisory Action", U.S. Appl. No. 15/466,778, dated Sep. 18, 2019, pp. 1 through 4, Published: US.

U.S. Patent and Trademark Office, "Final Office Action", U.S. Appl. No. 15/466,778, dated Apr. 1, 2019, pp. 1-19, Published: US.

U.S. Patent and Trademark Office, "Notice of Allowance", U.S. Appl. No. 15/466,778, dated Feb. 27, 2020, pp. 1-6, Published: US.

U.S. Patent and Trademark Office, "Notice of Allowance", U.S. Appl. No. 15/466,784, dated Mar. 29, 2019, pp. 1-15, Published: US.

U.S. Patent and Trademark Office, "Office Action", U.S. Appl. No. 15/466,778, dated Oct. 23, 2019, pp. 1 through 13, Published: US.

U.S. Patent and Trademark Office, "Office Action", U.S. Appl. No. 15/466,778, dated Nov. 13, 2018, pp. 1 through 19, Published: US.

U.S. Patent and Trademark Office, "Office Action", U.S. Appl. No. 15/466,784, dated Nov. 15, 2018, pp. 1 through 16, Published: US.

U.S. Patent and Trademark Office, "Supplemental Notice of Allowability", U.S. Appl. No. 15/466,784, dated May 16, 2019, pp. 1-2, Published: US.

Zhang et al., "Optimal Design of a Center Support Quadruple Mass Gyroscope (CSQMG)", "Engineering Research Center for Navigation Technology, Department of Precision Instruments", Apr. 28, 2016, pp. 1-16, vol. 16, No. 613, Publisher: Sensors 2016, Published in: Tsinghua University, Beijing 100084, China.

Zhou et al., "Innovationn of Flat Gyro: Center Support Quadruple Mass Gyroscope", "2016 IEEE International Symposium on Inertial Sensors and Systems", Mar. 21, 2016, pp. 1-4, Publisher: Date of Conference: Feb. 22-25, 2016.

European Patent Office, "Extended European Search Report from EP Application No. 20151313.2", from Foreign Counterpart to U.S. Appl. No. 16/298,879, dated Nov. 13, 2020, pp. 1 through 12, Published: EP.

U.S. Patent and Trademark Office, "Office Action", U.S. Appl. No. 16/298,879, filed Feb. 3, 2022, pp. 1 through 73, Published: US.

* cited by examiner

SYSTEMS AND METHODS FOR BIAS SUPPRESSION IN A NON-DEGENERATE MEMS SENSOR

CROSS REFERENCE TO RELATED APPLICATIONS

This application claims the benefit of U.S. Provisional Patent Application Ser. No. 62/342,132, filed on May 26, 2016, which is hereby incorporated herein by reference.

This application is a continuation of U.S. application Ser. No. 15/466,778, filed on Mar. 22, 2017, which is herein incorporated by reference.

STATEMENT REGARDING FEDERALLY SPONSORED RESEARCH OR DEVELOPMENT

This invention was made with Government support under Government Contract Number HR0011-16-9-0001 awarded by DARPA. The Government has certain rights in the invention.

BACKGROUND

Certain navigational applications have a need for high precision gyroscopes. For example, MEMS gyroscopes may be capable of providing high precision measurements. However, certain MEMS gyroscopes may be subject to bias errors, where the bias errors may be represented by a non-zero y-intercept of the plot of output signal vs. input rotational rate. A non-zero sensor bias may directly affect the navigation algorithms that rely on inertial sensing data. For instance, a non-zero bias may cause inertial sensors to indicate that an associated system is rotating when the system is actually stationary; the bias errors may lead to a navigation solution error that increases cubically with time. The bias errors may negatively affect the operation of inertial sensors used in GPS redundant airplane navigation and gyrocompassing (using the earth's rotation rate to locate the North Pole), where the GPS redundant airplane and gyrocompassing applications rely on inertial sensors with very low output biases.

One example of a MEMS gyroscope that is susceptible to bias errors is a tuning fork gyroscope. A tuning fork gyroscope consists of two proof masses which vibrate in an anti-phase mode with each other (driven axis). A tuning fork gyroscope measures rotation through the Coriolis effect which generates a force that is perpendicular to both the axis of rotation (input axis) and the velocity of the proof mass. Since the proof masses are driven in an anti-phase mode, when rotation is applied, the proof masses respond by moving in anti-phase along the axis of the Coriolis force (sense axis). The motion of the proof masses occurs at the drive frequency, where the drive frequency is the resonant frequency of the proof masses in the driven axis.

The bias error in the tuning fork gyroscope occurs due to vibratory rotation motion about the input axis at the driven frequency. The vibratory rotation causes the proof masses to move in the sense axis of the gyro at the driven frequency and generates a bias error signal. This vibratory rotation motion could occur through several mechanisms. One exemplary mechanism would be an excitation of rotational vibration in the circuit board which controls the tuning fork gyroscope. In this case, an imbalance in the driven motion of the sensor imparts force onto the circuit board, which in turn generates a rotational vibration.

SUMMARY

Systems and methods for suppressing bias errors in a non-degenerate vibratory structure are provided. In certain embodiments, a vibratory structure includes a first proof mass; a second proof mass, wherein the first proof mass and the second proof mass are driven into motion along a first axis, wherein the first proof mass and the second proof mass move in anti-phase along a second axis, wherein the motion of the first proof mass and the second proof mass along the second axis is such that the centers of mass of the first proof mass and the second proof mass move collinearly along a same axis.

DRAWINGS

Understanding that the drawings depict only exemplary embodiments and are not therefore to be considered limiting in scope, the exemplary embodiments will be described with additional specificity and detail through the use of the accompanying drawings, in which.

Figure 1:
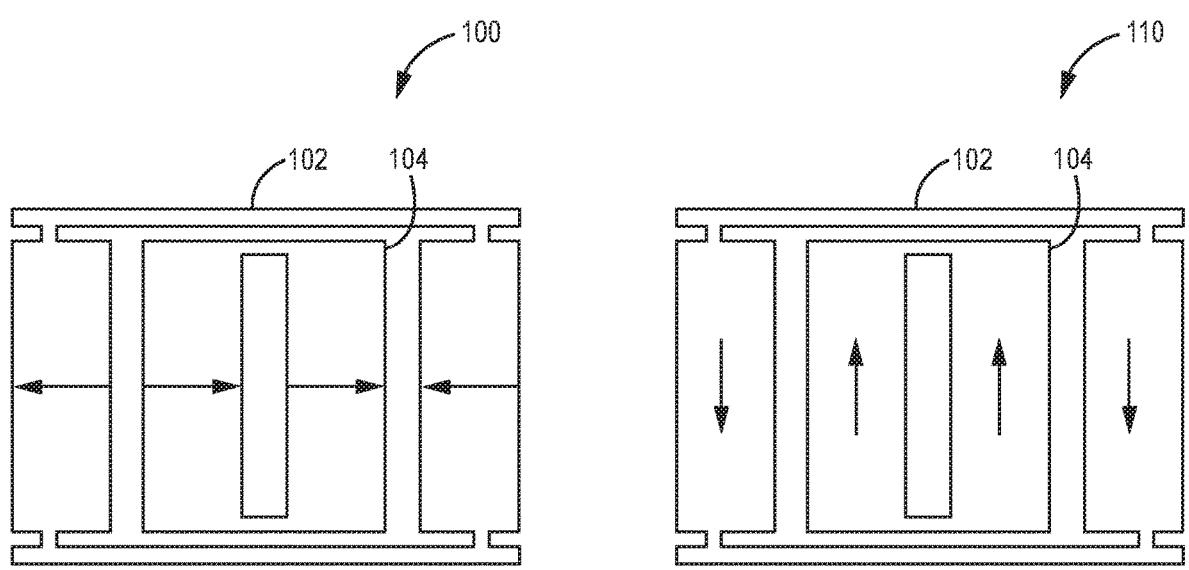
FIG. 1 is a diagram illustrating different vibratory modes for vibratory structure according to exemplary embodiments described herein.

In accordance with common practice, the various described features are not drawn to scale but are drawn to emphasize specific features relevant to the exemplary embodiments.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made. Furthermore, the method presented in the drawing figures and the specification is not to be construed as limiting the order in which the individual steps may be performed. The following detailed description is, therefore, not to be taken in a limiting sense.

Systems and methods for reducing imbalance driven bias errors are herein disclosed. For example, the imbalance driven bias errors may be reduced by fabricating a MEMS sensor such that the motion of the proof masses in the sense direction contains zero angular momentum. In certain implementations, the MEMS sensor may be a MEMS sensor having proof masses that are driven in anti-phase in the different vibration axes. In at least one embodiment, the MEMS sensor may be a non-degenerate MEMS sensor, where the proof masses have different frequencies for the anti-phase modes in the drive and sense direction. In at least one example, the MEMS sensor may have substantially zero angular momentum in the sense motion when the MEMS sensor has an inner proof mass within an outer proof mass where the inner proof mass and outer proof mass are symmetric across both the x and y axes.

FIG. 1 is a diagram of a MEMS sensor 100 having two proof-masses that vibrate with zero angular momentum. For example, the MEMS sensor may have an outer proof mass 102 and an inner proof mass 104 where the different proof masses vibrate in opposite directions along different axes. For example, when the MEMS sensor 110 experiences motion along a sense axis, the two proof masses vibrate with zero angular momentum. Further, as illustrated by the MEMS sensor 100, when the inner proof mass 104 experiences motion in one direction along the motor axis, the outer proof mass 102 experiences motion in the opposite direction along the motor axis. Similarly, as illustrated by the MEMS sensor 110 that shows motion along the sense axis, the outer proof mass 102 moves in an opposite direction when compared to the motion experienced by the inner proof mass 104.

Figure 2:
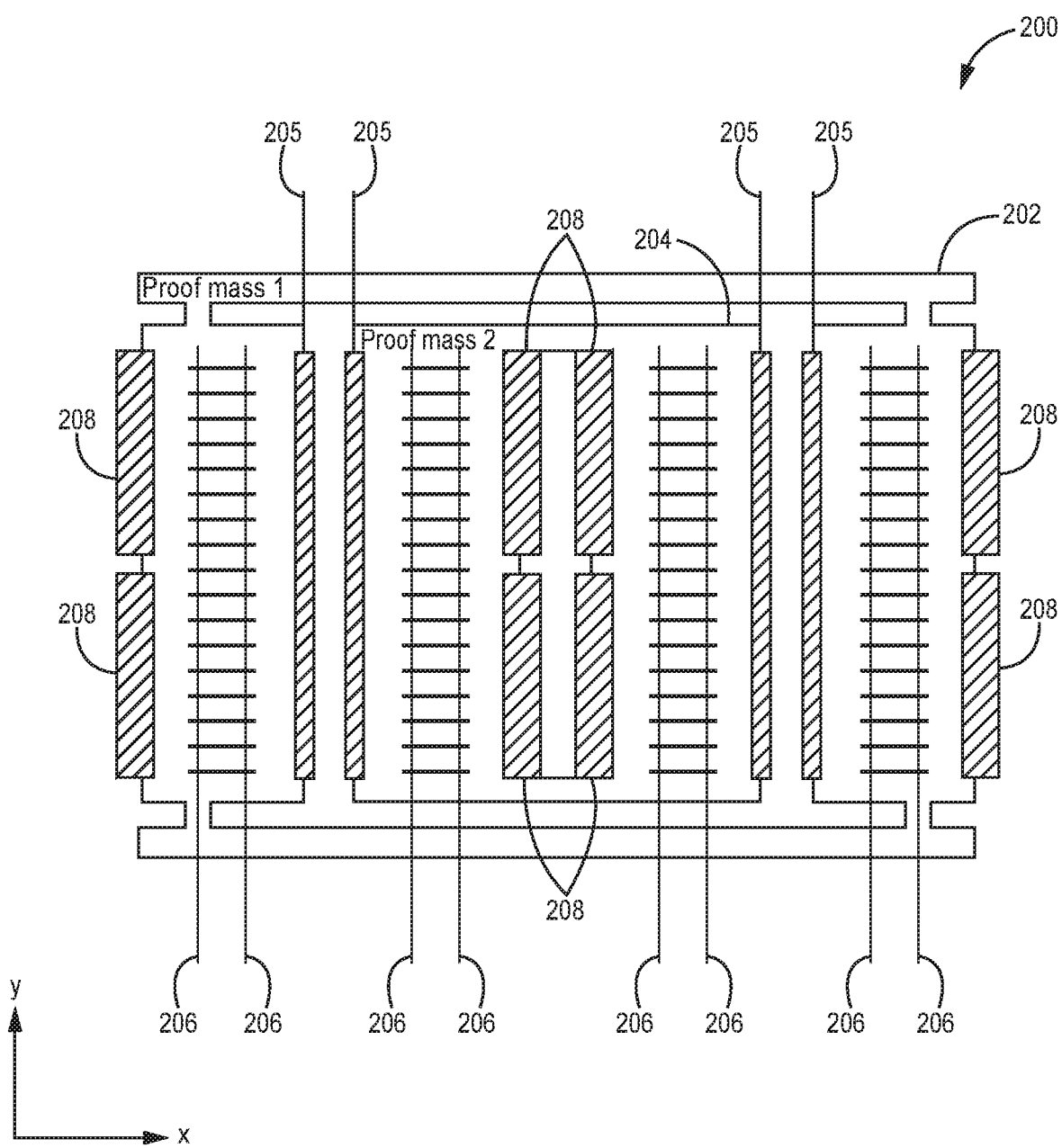
FIG. 2 is a diagram of a MEMS sensor with two-mass box-in-frame proof masses according to exemplary embodiments described herein.

FIG. 2 illustrates a further example of MEMS sensor where the two proof masses vibrate with zero angular momentum. In particular MEMS sensor 200 provides an example of a box-in-frame MEMS sensor having proof masses 202 and 204. For example, the MEMS sensor 200 includes an outer proof mass 202 and an inner proof mass 204. In certain implementations, the center of mass of the outer proof mass 202 and the center of mass of the inner proof mass 204 may be aligned with one another. When both the outer proof mass 202 and the inner proof mass 204 have center of masses that are aligned with one another, the proof masses may not be as susceptible to errors that may arise in a typical two proof mass sensor, where the two proof masses are on opposite sides of their combined center of mass of the MEMS sensor. As illustrated, the outer proof mass 202 and the inner proof mass 204 may vibrate in such a way so that there is zero angular momentum in the sense axis. If vibratory motion occurs for the typical two proof mass sensor with masses on opposite sides of their combined center of mass, during the vibratory motion, one proof mass will move up while the other moves down. This response will be identical to the response of the proof masses to the Coriolis force and therefore the vibratory motion will result in sensor bias. The aligning of the centers of mass cause both proof masses to respond to vibratory rotation motion in a way that does not produce output bias and preserves zero angular momentum in the sense axis. As the inner proof mass 204 responds to vibratory rotation motion, one side of the inner proof 204 mass will move up while the other moves down. Since sensor output is only generated when both sides of the inner proof mass 204 move in the same direction, the vibratory rotation effect will not generate bias. The outer proof mass 202 moves similarly to the inner proof mass 204, and thus also does not generate bias.

As illustrated in FIG. 2, the outer proof mass 202 and the inner proof mass 204 have drive combs 208 positioned on the proof masses 202 and 204. The drive combs 208 cause the different proof masses to vibrate along a driven axis in an anti-phase mode with each other. For example, if the proof masses 202 and 204 are driven along the x-axis, when the inner proof mass 204 moves towards the positive x direction, the outer proof mass 202 moves towards the negative x direction. Also, when the inner proof mass 204 moves towards the negative x direction, the outer proof mass 202 moves towards the positive x direction. The drive combs 208 may be implemented as capacitive plates, capacitive combs, piezo-suspensions, magnetic drives, and the like. In one or more implementations, one or both of the outer proof mass 202 and the inner proof mass 204 may include a first section and a second section that may be located on opposite sides of the center of mass, where the first and the second section are connected to one another through a first and second crossbar, where the first and second crossbars connect the first section to the second section such that the first and second crossbars are positioned symmetrically about the same center of mass.

In certain embodiments, the MEMS sensor 200 is equipped with sense electrodes on a substrate that sense the movement of the proof masses 202 and 204. The sense electrodes may sense the movement based on capacitance, magnetics, piezoresistivity, and the like. Accordingly, as the drive combs cause the proof masses 202 and 204 to vibrate along the x direction, the sense electrodes are able to sense the motion of the proof masses 202 and 204 with respect to a substrate. Connections 205 represent connections to sense electrodes that sense motion in the x direction and connections 206 represent connection to sense electrodes that sense motion in the y direction. The connections 205 and 206 provide measurements of motion to a processing unit, where the processing unit uses the measurements to calculate information that can be used for a navigation rate.

Figure 3:
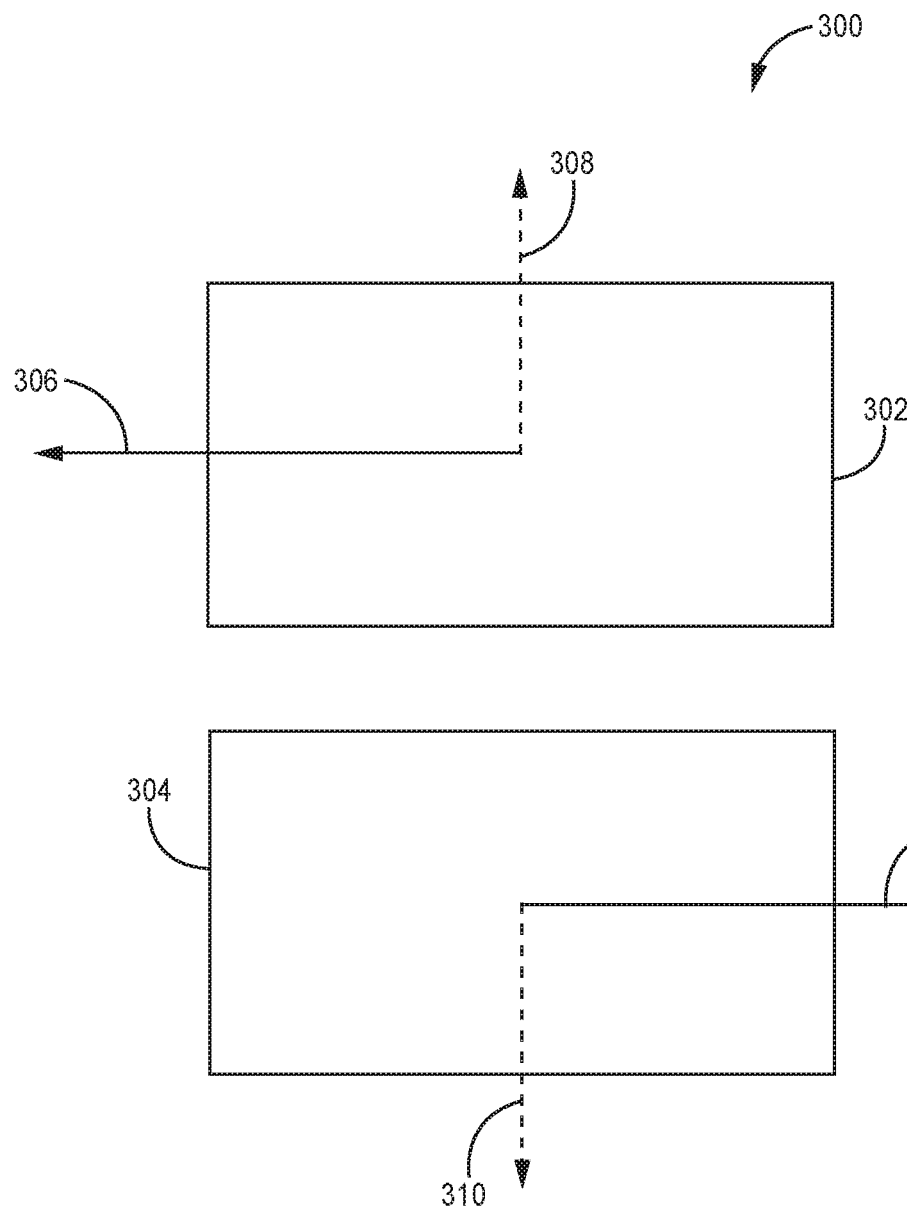
FIG. 3 is a diagram illustrating vibratory modes for a vibratory structure having two proof masses according to exemplary embodiments described herein.

FIG. 3 is a further diagram illustrating a MEMS sensor 300 having two proof masses that vibrate with zero-angular momentum in the sense axis. For example, the MEMS sensor 300 includes a first proof mass 302 and a second proof mass 304. The first proof mass 302 and the second proof mass 304 are of equal size and vibrate along respective drive and sense axes. For example, the first proof mass 302 is driven along drive axis 306 and vibrates along sense axis 308. Also, the second proof mass 304 is driven along drive axis 312 and vibrates along sense axis 308. The motion of both the first proof mass 302 and the second proof mass 304 is such that the MEMS sensor 300 has substantially zero angular momentum as the proof masses 302 and 304 move along their respective sense axes 308 and 310.

Figure 4:
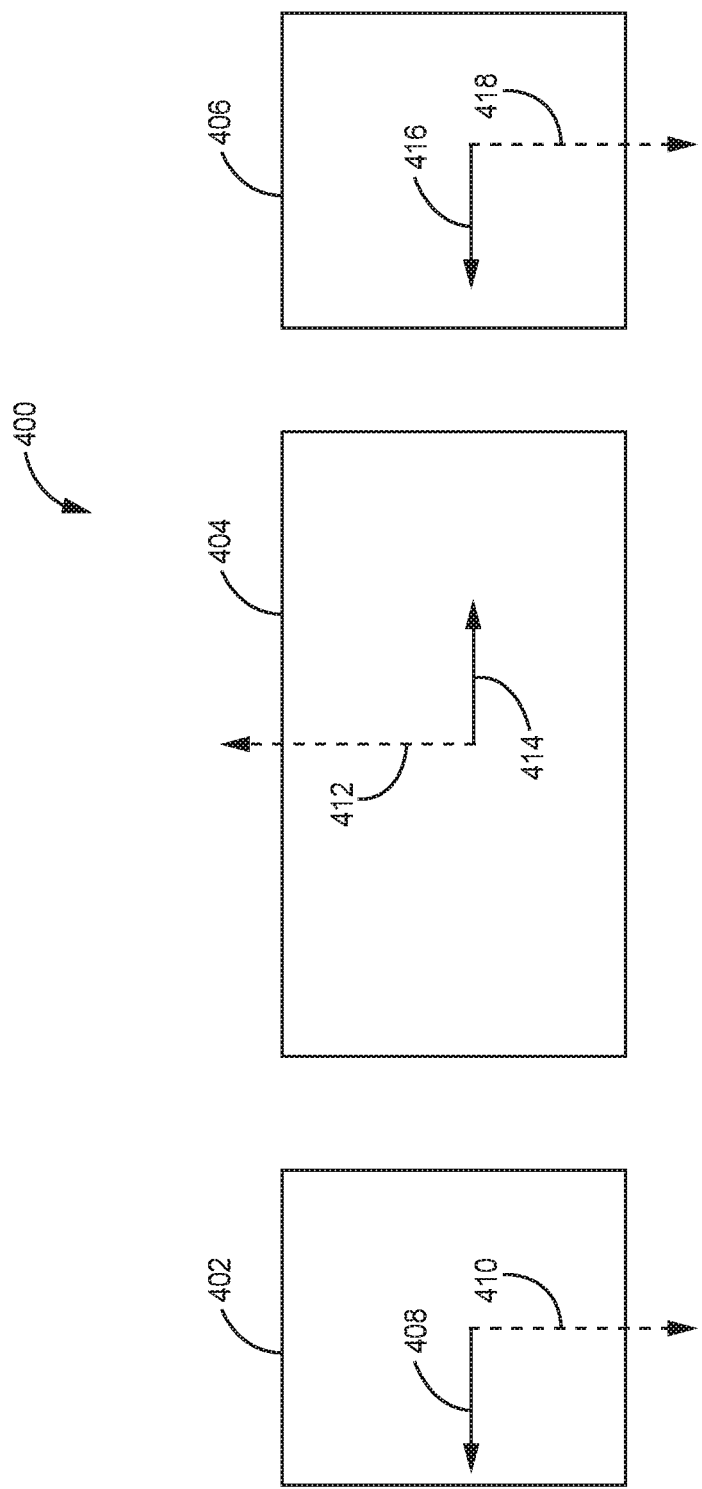
FIG. 4 is a diagram illustrating vibratory modes for a vibratory structure having three proof masses according to exemplary embodiments described herein.

FIG. 4 is a further diagram illustrating a MEMS sensor 400 having three proof masses that vibrate with substantially zero-angular momentum in the sense axis. For example, the MEMS sensor 400 includes a first proof mass 402, a second proof mass 404, and a third proof mass 406. The first proof mass 402 and the third proof mass 406 are of equal size and the second proof mass 404 is the same size of the combined sizes of the first proof mass 402 and the third proof mass 406. The first proof mass 402 is driven along drive axis 408 and vibrates along sense axis 410. The second proof mass 404 is driven along drive axis 412 and vibrates along sense axis 414. The third proof mass 406 is driven along drive axis 416 and vibrates along sense axis 418. The motion of the second proof mass 404 is such that it balances the motion of the first proof mass 402 and third proof mass 406 such that there is substantially zero angular momentum along the sense axes within the MEMS sensor 300.

Figure 5:
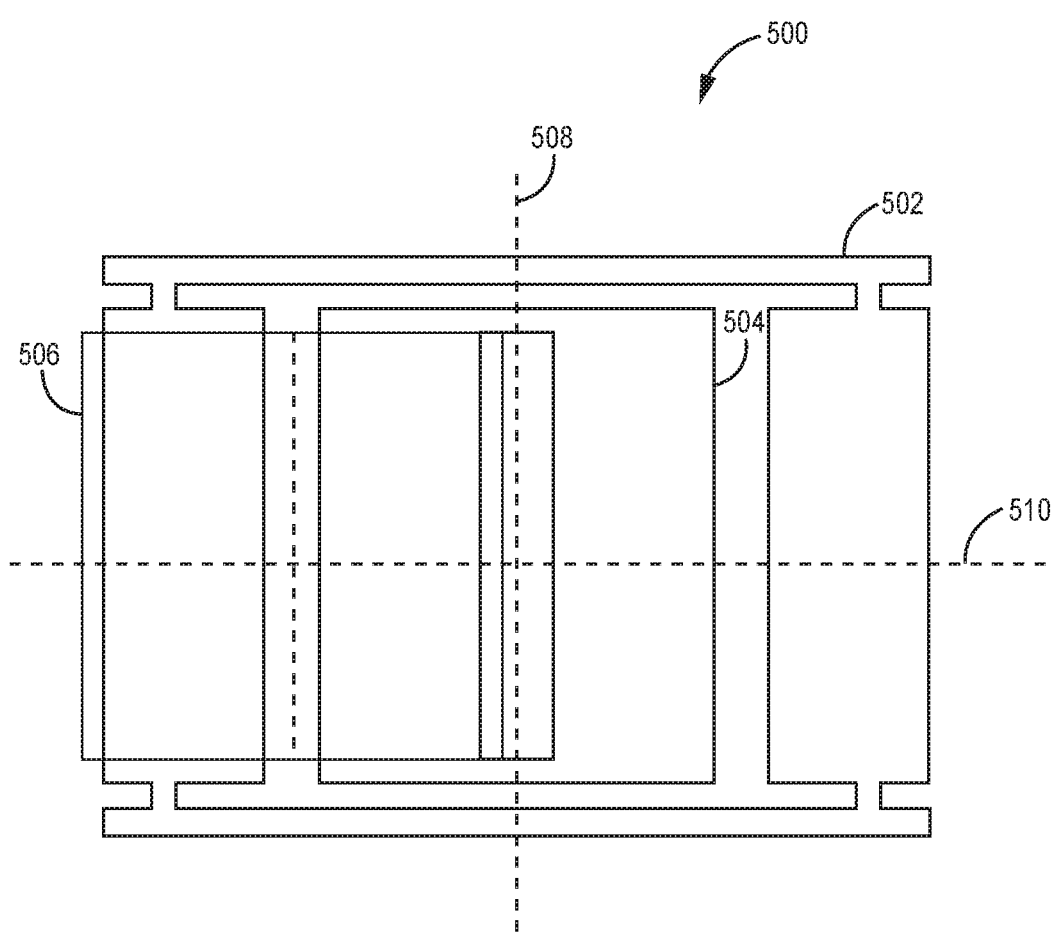
FIG. 5 is a diagram illustrating different axes of symmetry for MEMS sensors according to exemplary embodiments described herein.
Figure 6:
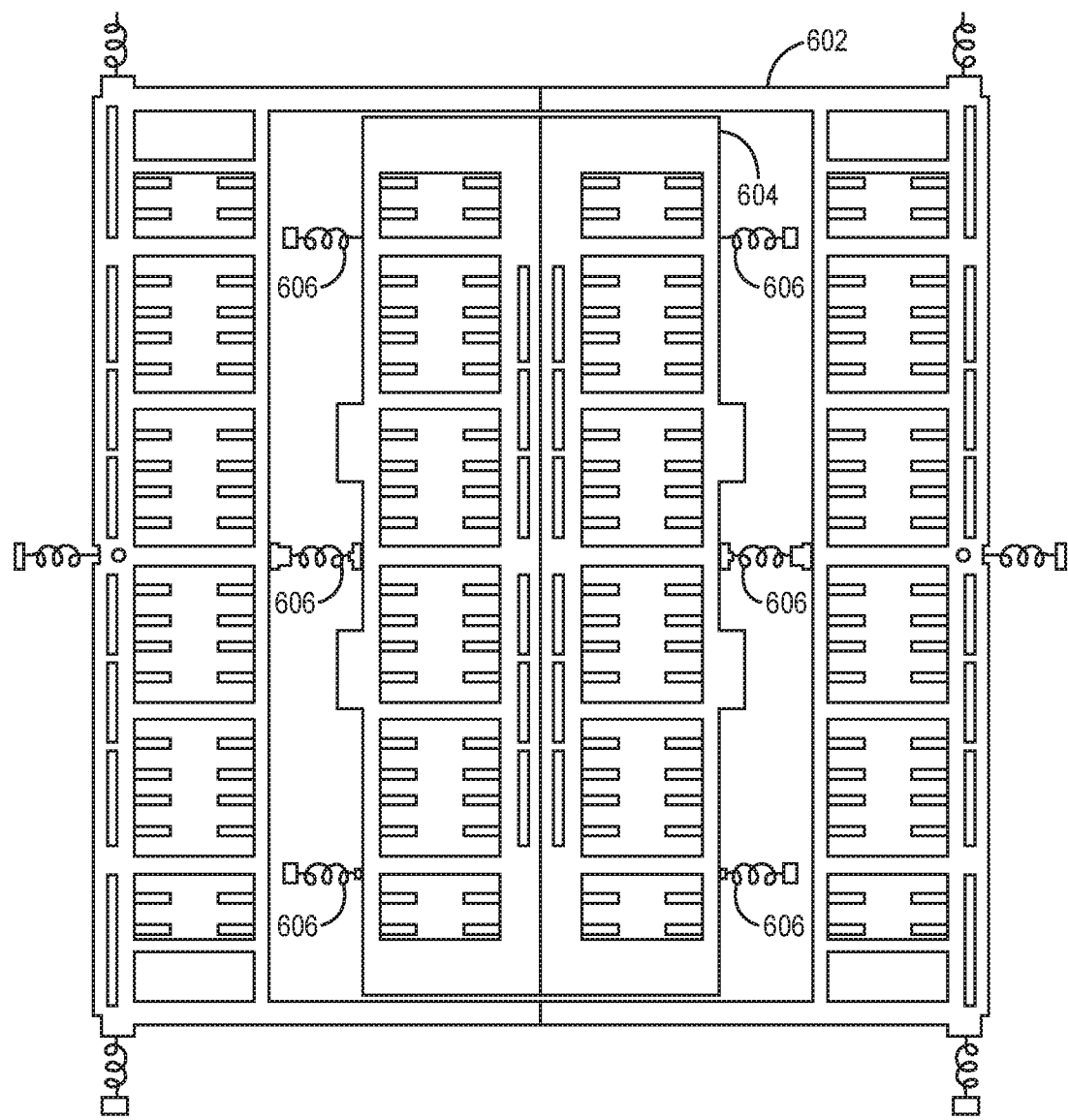
FIG. 6 is a diagram illustrating flexures for a MEMS sensor having two-mass box-in-frame proof masses according to exemplary embodiments described herein.

FIG. 5 is a diagram illustrating a MEMS sensor 500 having different lines of symmetry for the arrangement of the outer proof mass 502 and the inner proof mass 504. As illustrated, the arrangement illustrated has multiple lines of symmetry. For example, the arrangement of proof masses has local symmetry 506, wherein one side of the inner proof mass 504 is symmetric with the most proximate side of the outer proof mass 502. Also, each of the proof masses 502 and 504 are symmetrical about two orthogonal axes, axes 508 and 510, that pass through the center of mass. For example, a first vertical half of the MEMS sensor 500 is symmetrical with a second vertical half of the MEMS sensor 500 about a vertical axis 508 that passes through the center of mass of the MEMS sensor 500. Also, a first horizontal half of MEMS sensor 500 is symmetrical with a second horizontal half of the MEMS sensor 500 about a horizontal axis 510. The terms horizontal and vertical are relative terms that indicate that the horizontal axes is orthogonal to the vertical axis, however, the axes are not necessarily horizontal or vertical FIG. 6 illustrates the flexures and anchors 606 of a MEMS sensor 600 that are used to mount the inner proof mass 604 and outer proof mass 602 to a substrate. For example, the flexures connect the inner proof mass 604 to the outer proof mass 602 and the flexures also connect the inner proof mass 604 and the outer proof mass 602 to the anchors 606. The flexures may be spring type flexures or other type of flexure known to one having skill in the art. In at least one implementation, the flexures may be designed for zero net force on the anchors 606. Alternatively, the flexures may be designed for a non-zero net force on the anchors 606. Further, in certain implementations, directly coupling flexures between proof masses may provide sense mode separation from symmetric translation.

Figure 7:
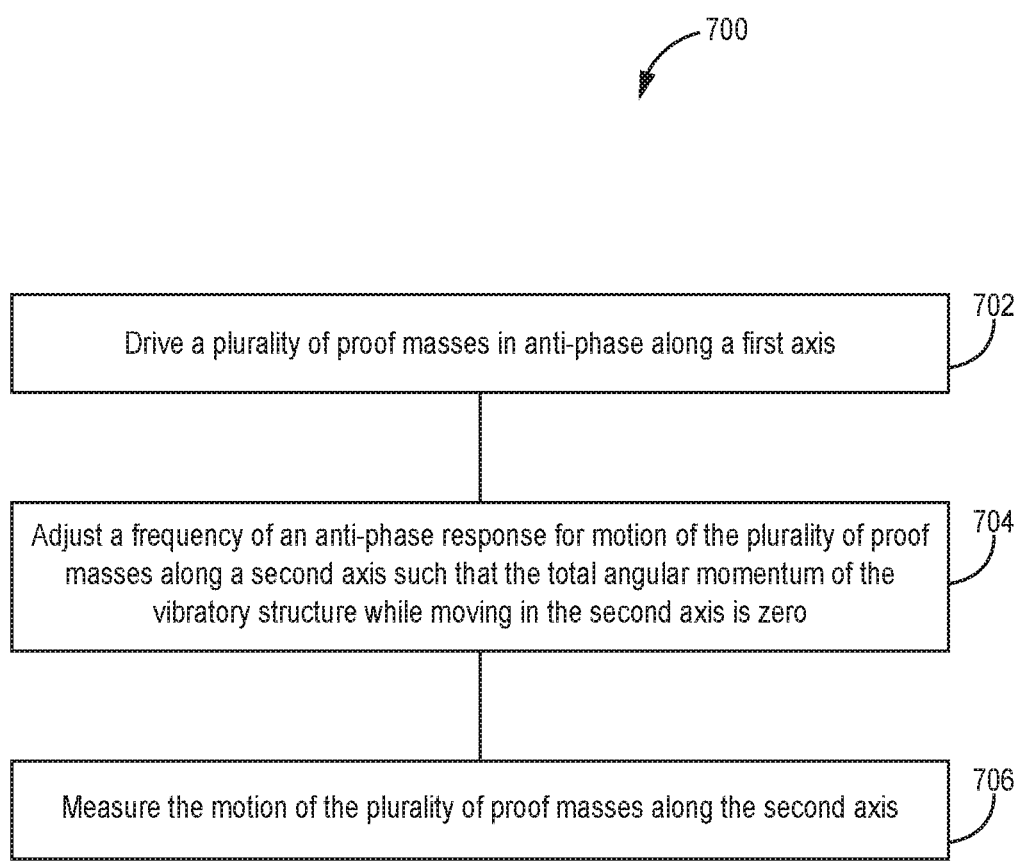
FIG. 7 is a flow diagram for a method for suppressing imbalance driven bias errors according to exemplary embodiments described herein.

FIG. 7 is a flow diagram illustrating a method 700 for suppressing imbalance driven bias errors in a MEMS sensor. For example, method 700 proceeds at 702, where a plurality of proof masses are driven in anti-phase along a first axis. Further, method 700 may proceed at 704, where a frequency of an anti-phase response for motion of the plurality of proof masses along a second axis is adjusted such that the total angular momentum of the vibratory structure while moving in the second axis is zero, wherein the second axis is orthogonal to the first axis. Also, method 700 may proceed at 706, where the motion of the plurality of proof masses along the second axis may be measured.

EXAMPLE EMBODIMENTS

Example 1 includes a vibratory structure, the vibratory structure comprising: a first proof mass; a second proof mass, wherein the first proof mass and the second proof mass are driven into motion along a first axis, wherein the first proof mass and the second proof mass move in anti-phase along a second axis, wherein the motion of the first proof mass and the second proof mass along the second axis is such that the centers of mass of the first proof mass and the second proof mass move collinearly along a same axis.

Example 2 includes the vibratory structure of Example 1, wherein the motion of the first proof mass and the second proof mass is such that the total angular momentum of the vibratory structure while moving along the second axis is zero.

Example 3 includes the vibratory structure of any of Examples 1-2, wherein the resonant frequencies of the motion along the first axis and the second axis are non-degenerate.

Example 4 includes the vibratory structure of any of Examples 1-3, wherein the structure is a MEMS sensor.

Example 5 includes the vibratory structure of any of Examples 1-4, wherein the motion of the proof masses in the second axis is determined to produce an output proportional to a measured quantity.

Example 6 includes the vibratory structure of Example 5, wherein the measured quantity is a measure of rotation rate.

Example 7 includes the vibratory structure of any of Examples 1-6, further comprising a third proof mass, wherein the first proof mass, the second proof mass, and the third proof mass are driven in a first axis, and the motion of the second proof mass and third proof mass is along the second axis.

Example 8 includes the vibratory structure of any of Examples 1-7, wherein the first proof mass comprises first proof mass drive combs and/or the second proof mass comprises second proof mass drive combs.

Example 9 includes the vibratory structure of any of Examples 1-8, further comprising a substrate, wherein a plurality of sense electrodes are mounted on the substrate.

Example 10 includes the vibratory structure of Example 9, further comprising a plurality of anchors mounted on the substrate, wherein the anchors are coupled to the first proof mass and/or the second proof mass through a plurality of flexures.

Example 11 includes the vibratory structure of any of Examples 1-10, wherein a first side of the first proof mass is locally symmetrical with a first side of the second proof mass and a second side of the first proof mass is locally symmetrical with a second side of the second proof mass, wherein, the first side of the first proof mass is proximate to the first side of the second proof mass and the second side of the first proof mass is proximate to the second side of the second proof mass.

Example 12 includes a method for suppressing bias errors in a vibratory structure, the method comprising: driving a plurality of proof masses in anti-phase along a first axis; adjusting a frequency of an anti-phase response for motion of plurality of proof masses along a second axis such that the total angular momentum of the vibratory structure while moving in the second axis is zero, wherein the second axis is orthogonal to the first axis; and measuring the motion of the plurality of proof masses along the second axis.

Example 13 includes the method of Example 12, wherein the motion of the plurality of proof masses is such that the centers of mass for each proof mass in the plurality of proof masses move collinearly along a same axis.

Example 14 includes the method of any of Examples 12-13, wherein the resonant frequencies of the motion along the first axis and the second axis are non-degenerate.

Example 15 includes the method of any of Examples 12-14, wherein the vibratory structure is a MEMS sensor.

Example 16 includes the method of any of Examples 12-15, wherein the motion of the plurality proof masses along the second axis is determined to produce an output proportional to a measured quantity.

Example 17 includes the method of Example 16, wherein the measured quantity is a measure of rotation rate.

Example 18 includes a vibratory structure, the vibratory structure comprising: a substrate; a first proof mass; a second proof mass, wherein the first and second proof mass are driven along a first axis, wherein the first and second proof mass move in anti-phase in a second axis, wherein the motion of the two proof masses along the second axis is such that the total angular momentum of the vibratory structure while moving in the second axis is zero; a plurality of anchors mounted on the substrate; a plurality of flexures, wherein the anchors are coupled to the first proof mass and the second proof mass through the plurality of flexures; and a plurality of sense electrodes mounted on the substrate, wherein the plurality of sense electrodes sense motion of the first proof mass and the second proof mass in the second axis.

Example 19 includes the vibratory structure of Example 18, wherein the motion of the plurality of proof masses is such that the centers of mass for each proof mass in the plurality of proof masses move collinearly along a same axis.

Example 20 includes the vibratory structure of any of Examples 18-19, wherein the resonant frequencies of the motion along the first axis and the second axis are non-degenerate.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

The invention claimed is:

1. A sensor, comprising:
    first and second proof masses connected together directly and rigidly with a rigid member, wherein the first and second proof masses are configured to be driven at a same phase; and
    a third proof mass configured to be driven in antiphase to the first and second proof masses, wherein the third proof mass is disposed between the first and second proof masses;
    the first, second, and third proof masses being configured to move in response to a Coriolis force such that a combined angular momentum of the first, second, and third proof masses is substantially zero.

2. The sensor of claim 1, wherein resonant frequencies of respective motions of the first, second, and third proof masses in at least one dimension are non-degenerate.

3. The sensor of claim 1, further comprising a circuit configured:
    to determine a respective Coriolis-force-induced motion of each of at least one of the first and second proof masses; and
    to produce, in response to the determined respective Coriolis-force-induced motion of each of at least one of the first and second proof masses, an output proportional to a measured quantity.

4. The sensor of claim 3, wherein the measured quantity is a measure of rotation rate.

5. The sensor of claim 1, wherein at least one of the first and second proof masses includes a respective proof-mass drive comb.

6. The sensor of claim 1, further comprising:
    a substrate; and
    sense electrodes mounted to the substrate and configured to sense Coriolis-force-induced movement of one or more of the first, second, and third proof masses.

7. The sensor of claim 6, further comprising:
    anchors mounted to the substrate; and
    flexures connecting at least one of the first, second, and third proof masses to the anchors.

8. The sensor of claim 1, wherein a sum of respective masses of the first and second proof masses substantially equals a mass of the third proof mass.

9. The sensor of claim 1, wherein the third proof mass is configured to be driven substantially collinearly with the first and second proof masses.

10. A method, comprising:
    driving outer proof masses at a phase, wherein the outer proof masses are directly and rigidly interconnected with a rigid member;
    driving an inner proof mass at an antiphase, wherein the inner proof mass is disposed between the outer proof masses; and
    allowing the outer proof masses and the inner proof mass to move in response to a Coriolis force such that a total angular momentum of the outer proof masses and the inner proof mass is substantially zero.

11. The method of claim 10, further comprising determining a rate of rotation about an input axis in response to movement of at least one of the outer proof masses and the inner proof mass.

12. The method of claim 10, further comprising measuring a respective Coriolis-force-induced motion of each of at least one of the outer proof masses.

13. The method of claim 10, wherein driving the outer and inner proof masses includes driving the outer and inner proof masses such that respective centers of mass of the outer and inner proof masses move along a same axis.

14. The method of claim 10, further comprising measuring respective Coriolis-force-induced motions of the outer proof masses and of the inner proof mass.

15. The method of claim 10, further comprising:
    determining respective Coriolis-force-induced motions of the outer and inner proof masses; and
    generating, in response to the determined respective Coriolis-force-induced motions, an output signal proportional to a measured angular velocity.

16. A system, comprising:
    a gyroscope, including:
        first and second proof masses connected together directly and rigidly with a rigid member, wherein the first and second proof masses are configured to be driven at a same phase; and
        a third proof mass configured to be driven in antiphase to the first and second proof masses, wherein the third proof mass is disposed between the first and second proof masses;
        the first, second, and third proof masses being configured to move in response to a Coriolis force such that a combined angular momentum of the first, second, and third proof masses is substantially zero.

17. The system of claim 16, further comprising a navigation subsystem onboard which the gyroscope is disposed.

18. The system of claim 17, further comprising a vehicle onboard which the navigation subsystem is disposed.

19. A sensor, comprising:
    first and second proof masses, wherein the first and second proof masses are directly and rigidly interconnected with a rigid member, and
    a third proof mass, wherein the third proof mass is disposed between the first and second proof masses,
    wherein the first, second, and third proof masses are configured to exhibit
        substantially zero combined angular momentum in response to a driving force; and
        motion related to an angular rotation rate about an input axis in response to a Coriolis force.

* * * * *